United States Patent [19]
Holdcroft et al.

[11] Patent Number: 5,561,030
[45] Date of Patent: Oct. 1, 1996

[54] FABRICATION OF ELECTRONICALLY CONDUCTING POLYMERIC PATTERNS

[75] Inventors: Steven Holdcroft, Port Moody; Mohamed S. A. Abdou, Burnaby, both of Canada

[73] Assignee: Simon Fraser University, Burnaby, Canada

[21] Appl. No.: 235,215

[22] Filed: Apr. 29, 1994

Related U.S. Application Data

[63] Continuation-in-part of Ser. No. 946,106, Sep. 17, 1992, abandoned, which is a continuation-in-part of Ser. No. 707,815, May 30, 1991, abandoned.

[51] Int. Cl.[6] .................................................. G03F 7/00
[52] U.S. Cl. ........................ 430/311; 430/296; 430/325; 430/396; 430/942; 430/967
[58] Field of Search ..................................... 430/311, 325, 430/296, 396, 942, 966, 967; 522/118; 525/371; 526/256

[56] References Cited

U.S. PATENT DOCUMENTS

5,200,112  4/1993  Angelopoulos ........................ 252/500

*Primary Examiner*—Kathleen Duda
*Attorney, Agent, or Firm*—Oyen Wiggs Green & Mutala

[57] ABSTRACT

Thin films of substantially pure soluble polythiophenes and oligothiophenes undergo cross-linking and insolubilization upon irradiation with UV/visible light, without additives. Irradiation of thin polymer films through a photomask and subsequent development with solvent leaves a polymeric image of the mask. The resulting $\pi$-conjugated polymeric pattern can be rendered electronically conducting by oxidation. The electronic conductivity of these films is high and is similar to that found for oxidized, non-irradiated films. Furthermore, the conductivity can be regulated over eight orders of magnitude by controlled oxidation. Thus, the fabrication of electronically conducting, organic "wires" or "channels" using conventional semiconductor photolithographic techniques can be achieved.

30 Claims, 4 Drawing Sheets

FABRICATION OF ELECTRONICALLY CONDUCTING POLYMERIC PATTERNS

This application is a continuation-in-part of application Ser. No. 07/946,106, filed Sep. 17, 1992, now abandoned, which was a continuation-in-part of application Ser. No. 07/707,815, filed May 30, 1991, now abandoned.

FIELD OF THE INVENTION

This invention relates to processes for fabricating electronically conducting polymeric patterns. More particularly, this invention relates to fabricating electronically conducting polymeric patterns from thin films of soluble polythiophenes and oligothiophenes which undergo cross-linking and insolubilization upon irradiation with UV/visible light.

BACKGROUND OF THE INVENTION

Integrated circuitry requires deposition of electronically conducting channels through which electronic communication between active and passive components then takes place. The dimensions of electronic conducting channels vary widely depending on device requirements. In microchip technology, such dimensions are micron and submicron, whereas in printed board circuitry much larger dimensions can be tolerated. Lithography is the driving force for both the macro- and micro-scale integrated circuit technology (L. F. Thompson, C. G. Wilson, and M. J. Bowden, Eds., "Introduction to Microlithography", ACS Symposium Series 219, Washington D.C., 1983).

Commercially, the fabrication of conducting channels is accomplished using one of two standard multi-step photolithographic techniques. In the first, a 1 to 2 µm thick film of photosensitive polymeric material (photoresist) is deposited, usually by spin casting, on top of an inert substrate. Baking of the polymer is often required to improve film characteristics. Two types of resist are available, those which dissolve at a decreased rate following exposure to UV or visible light (negative resists), and those which exhibit an increased rate of dissolution (positive resists) following exposure to UV or visible light.

Initially, a relief image is formed in the photoresist by selective exposure to UV irradiation through a photomask. Pattern development is achieved by dissolution of the exposed or unexposed resist. Metal is then vapour deposited over the whole surface. The bare and exposed surface receives a layer of metal whereas those regions still covered by polymer resist material do not. The formation of isolated electronically conducting channels is achieved by removal of the remaining polymer resist.

In the second method, the metallic layer is deposited onto the inert surface prior to casting the polymer resist layer. Following baking, the resist is exposed through a photomask, and the exposed or unexposed photoresist is removed by dissolution. Etching of the exposed metal and removal of the remaining polymer resist renders the metallic conducting pattern. In both methods, fabrication of metallic structures on surfaces is time consuming, and costly, due to the large number of intricate procedures involved.

An alternative process to photolithography involves direct laser write technology wherein a monochromatic laser beam of controlled dimensions is focused upon, and scanned across the surface of the polymer resist film. The image generated in the film is a copy of the path scribed by the laser beam. Computer aided design is employed to fabricate structures useful for electronic devices. In the context of lithography, laser beams replace and are analogous to the UV lamp/photomask arrangement, but all other steps in the fabrication of conducting channels are virtually the same.

U.S. Pat. No. 5,109,149, Leung, issued Apr. 28, 1992, is directed to a laser, direct-write system for making personalized custom or semi-custom integrated circuits with a very fast turnaround time. The system includes a method and apparatus for high precision scanning of a submicron laser spot. The laser beam is scanned at the entrance of a beam expander. The beam expander reduces the scan angle and error produced by a mechanical scanning device such as a rotating polygonal mirror. The smaller scan angle at the output of the beam expander matches well with the projection optics of a laser, direct-write semi-custom integrated circuit production system. The scan error reduction permits more accurate positioning of the focussed laser spot on the surface of the semi-custom integrated circuit.

Japanese Patent Application No. 88232654, Kokai, involves formation of a conducting polypyrrole pattern by irradiating a polymer film consisting of pyrroles, electrolyte, redox polymer. Irradiation causes a redox reaction resulting in polymerization of pyrrole to a conducting form.

The present invention has the following significant distinctions from Japanese Patent Application No. 88232654:

1. The concept of image formation in the present invention is photo-crosslinking and insolubilization. In Japanese Patent Application No. 88232654, it is a photopolymerization.

2. The present invention requires one component. No other components are present or necessary. Japanese Patent Application No. 88232654 requires monomer, electrolyte and redox polymer.

3. The conductivity of the image in the present invention can be readily controlled. In Japanese Patent Application No. 88232654, it cannot.

4. The present invention involves a solid state reaction and image processing is totally compatible with present lithographic technologies. High resolution (micron) can be obtained. The same cannot be said for the Japanese patent.

5. The present invention utilizes preformed polymers which may be varied and controlled. The Japanese patent utilizes pyrrole monomers. The properties of the resultant polymer cannot be controlled.

U.S. Pat. No. 4,962,158, Oct. 9, 1990, Kobayashi et al., discloses a radical polymerizable composition comprising (1) a compound having a pi-electron conjugated structure and (2) a radical polymerizable compound, which is useful for molding into an arbitrary shape, which can be rendered electrically conductive and which is therefore useful as a material for electrodes or circuits in the electrical and electronic industry.

Specifically, a composite comprising a conducting polymer and a polymerizable free radical compound is rendered insoluble by a free radical initiator. When the initiator is activated by light, this leads to photoinsolubilization of the polymerizable free radical compound. The insolubilization step involves the polymerizable component, not the conducting polymer.

U.S. Pat. No. 5,137,799, Aug. 11, 1992, Kaempf et al., discloses an electrically conductive resist material comprising (1) at least one polymer which is sensitive to ionizing radiation and (2) a soluble electrically conductive oligomer or polymer. A process for producing the resist material is also described, comprising admixing an electrically conductive oligomer or polymer dissolved in a solvent to at least one polymer which is sensitive to ionizing radiation. The resist material is useful in preparing electron beam resists which prevent electrostatic charging and resultant electrostatic fields.

When the radiation sensitive polymer, namely, poly(m-ethylmethacrylate), is irradiated, chain scission of that polymer occurs and the mixture is therefore rendered more soluble. The conducting polymer is not affected. As with the process disclosed in Kobayashi et al., the key component in Kaempf et al. is the reaction of the non-conducting polymer, not the conducting polymer. In this sense, Kaempf et al. are very similar to Kobayashi et al. However, in Kaempf et al., the non-conductive polymers are degraded by irradiation rather than being cross-linked. As a result of the conductive polymer being only a minor component of the combination in Kaempf et al., the conductivities of the Kaempf et al. system are not very large.

Neither Kobayashi et al. nor Kaempf et al. teach that a pi-conjugated polymer can be insolubilized by cross-linking and that the cross-linked polymers can be rendered electrically conducting by oxidation.

Strategies for obtaining chemically related polymers possessing superior electronic conductivity, environmental stability, processability, and synthetic efficacy have been actively pursued ever since the discovery that polyacetylene can be oxidized to yield materials of high electronic conductivity. With few exceptions, it is the oxidized form of $\pi$-conjugated polymers which have received most attention. Unfortunately, many of them are unstable and revert back to their neutral insulating state too quickly for practical use. One such class of polymer, poly(3-alkylthiophenes), while possessing high coductivity and good processability, loses its conductivity in a matter of hours.

SUMMARY OF THE INVENTION

In accordance with the invention, thin films of soluble polythiophenes and oligothiophenes undergo cross-linking and insolubilization upon irradiation with UV/visible light, in the region 250 to 700 nm. Irradiation of thin polymer films through a photomask and subsequent development with solvent leaves a polymeric image of the mask. The resulting $\pi$-conjugated polymeric pattern can be rendered electronically conducting by chemical oxidation. The electronic conductivity of the formed films, which do not include diluting additives, is very high and is similar to that found for oxidized, non-irradiated films. The fabrication of electronically conducting, organic "wires" or "channels" using conventional semiconductor photolithographic techniques can be achieved.

The invention is directed to a method of forming an image comprising: (a) depositing a film of a $\pi$-conjugated polymer or oligomer; and (b) irradiating the film with UV/vis light through a photomask. The deposited film can also be exposed to laser light. The non-irradiated or non-exposed regions of the film can be dissolved using an appropriate solvent to thereby leave a pattern. The cross-linked exposed regions can be oxidized to make them electronically conductive.

The invention is also directed to a method of forming electronically conducting patterns of an oxidizable $\pi$-conjugated polymer or $\pi$-conjugated oligomer which are electrically conducting in their oxidized form consisting essentially of: (a) irradiating substantially pure $\pi$-conjugated polymer or $\pi$-conjugated oligomer, which is free of additives, with light from a light source through a photomask positioned between the $\pi$-conjugated polymer or $\pi$-conjugated oligomer and the light source to produce unexposed photomask corresponding regions of unirradiated $\pi$-conjugated polymer or $\pi$-conjugated oligomer, and exposed photomask corresponding irradiated regions of cross-linked $\pi$-conjugated polymer or $\pi$-conjugated oligomer; (b) dissolving the unirradiated regions of the $\pi$-conjugated polymer or $\pi$-conjugated oligomer using an appropriate solvent and leaving behind irradiated regions of undissolved cross-linked $\pi$-conjugated polymer or $\pi$-conjugated oligomer; and (c) oxidizing the undissolved irradiated regions of cross-linked $\pi$-conjugated polymer or cross-linked $\pi$-conjugated oligomer with an oxidant to form an electrically conducting pattern.

In the method as disclosed, the $\pi$-conjugated polymer of $\pi$-conjugated oligomer can be exposed to laser light at specified photomask locations. The $\pi$-conjugated polymer or $\pi$-conjugated oligomer does not have any precurser.

In the method as disclosed, the $\pi$-conjugated polymer or $\pi$-conjugated oligomer can be deposited on a substrate selected from the group consisting of silicone, III-E semiconductor material, glass, polymer sheet, and an oxide substance, before the polymer is irradiated.

In the method, the solvent used to dissolve the unexposed $\pi$-conjugated polymer or $\pi$-conjugated oligomer can be an aromatic solvent, an aliphatic ester solvent, an ether, a chlorinated solvent, a glycol ether solvent, a ketone or water.

In the method as disclosed, the oxidant used to impart electronic conductivity to the $\pi$-conjugated polymer or $\pi$-conjugated oligomer can be selected from the group of substances consisting of nitrosonium salts, halogens and inorganic oxidizing compounds selected from the group consisting of ferric and ceric salts.

In the method as disclosed, the $\pi$-conjugated polymer or $\pi$-conjugated oligomer in step (c) can be oxidized electrochemically or is oxidized photochemically by incorporating prior to irradiation a photochemically active oxidant in the $\pi$-conjugated polymer or $\pi$-conjugated oligomer.

In the method, the oxidant used to impart electronic conductivity to the $\pi$-conjugated polymer or $\pi$-conjugated oligomer can be a soluble auric compound.

In the method, the undissolved irradiated $\pi$-conjugated polymer or $\pi$-conjugated oligomer can be treated prior to irradiation with a soluble auric compound to form metallic layers of gold on the $\pi$-conjugated polymer or $\pi$-conjugated oligomer.

In the method, the $\pi$-conjugated polymer or $\pi$-conjugated oligomer can be a $\pi$-conjugated polythiophene or $\pi$-conjugated oligothiophene. The $\pi$-conjugated polythiophene or $\pi$-conjugated oligothiophene can be derivatized at the 3- or 3,4- position with ether, amide, alkyl, alkoxy or any other chemical functional group which promotes solubility of the unirradiated polymer.

In the method, the $\pi$-conjugated polymer or $\pi$-conjugated oligomer can be based on a substance selected from the group consisting of 3-alkylthiophene, 3,4-alkylthiophene, 3-alkoxythiophene, 3,4-alkoxythiophene and 3-alkylsulphonate.

In the method as disclosed, the $\pi$-conjugated polymer or $\pi$-conjugated oligomer can be a thiophene block joined at the $\alpha$ position by an alkyl group, a ketone group, an aromatic group, an amide, an ether or an ester.

In the method, the auric compound can be selected from the group of substances consisting of soluble gold trichloride, soluble gold. tribromide, soluble gold tricyanide and chloroauric acid.

In the method as disclosed, the π-conjugated polymer or π-conjugated oligomer can be selected from the group consisting of poly(thienylvinylene), polyacetylene, polypyrrole, poly(3-alkoxythiophene) and polythiophene.

In the method, the photomask can be absent and the π-conjugated polymer or π-conjugated oligomer can be irradiated by laser light lithography. The π-conjugated polymer or π-conjugated oligomer can be deposited as a thin film.

In the method as disclosed, the undissolved cross-linked π-conjugated polymer or π-conjugated oligomer can be photochemically oxidized by photolysis of a photochemically active oxidant incorporated in the π-conjugated polymer or π-conjugated oligomer. The active oxidant can be diaryliodonium or triarylsulfonium salt.

In the method, the light can be gamma, X-ray, UV or visible. The light can be UV/visible light, specifically 250 to 700 nm.

DRAWINGS

In drawings which illustrate specific embodiments of the invention, but which should not be construed as restricting the spirit or scope of the invention in any way:

FIGS. 4A and 4B illustrate the changes in UV/vis absorption spectra of oxidized films of poly(3-hexylthiophene). In FIG. 4A, the oxidant is $AuCl_3$. Line (a) represents before oxidation, line (b) represents oxidized polymer where t=0 min, and line (c) (which is superimposed on line (b)) represents t=3 weeks. In FIG. 4B, the oxidant is $FeCl_3$. Line (a) indicates before oxidation, line (b) represents oxidized polymer (t=0 min), line (c) represents t=60 min.

GENERAL DESCRIPTION OF THE INVENTION

Figure 1:
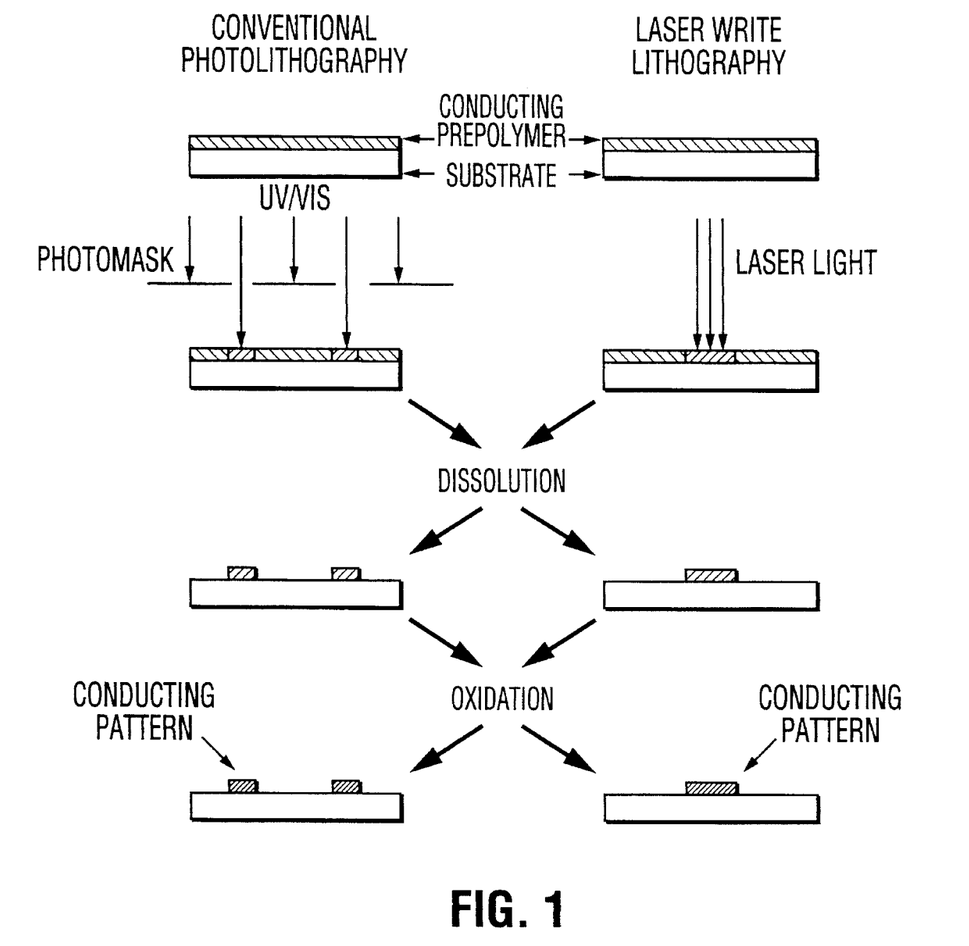
FIG. 1 represents a schematic flow chart of the invention incorporated into photolithographic and direct laser write image processing.

In the invention, electronically conductive channels can be fabricated with speed and precision using photosensitive electronically conducting polymers, in which the "photoresist" itself can be made electronically conducting. The number of lithographic steps is conveniently reduced, yet the process is compatible with conventional lithography. Considerable savings in time and expense can be achieved. This invention applies both to photolithographic and to direct-laser write image processing (see FIG. 1 which represents a schematic flow chart of the invention incorporated into photolithographic and direct laser write image processing).

In the present invention, electronically conducting polymers replace metallic components. Thus, in addition to the ease of processing and reduced cost, a number of unforeseen benefits of this technology might arise. For instance, polymeric contacts are much more flexible than metallic counterparts.

Organic polymers exhibiting conjugation via π-orbital overlap are unique in that they can be chemically oxidized to yield electronically conducting materials (B. Skotheim, Ed., "Handbook of Conducting Polymers", Vol. 1 & 2, Marcel Dekker, N.Y., 1986). Such materials are gaining prominence in microelectronic applications because of their ease of processing and compatibility with lithographic systems (see U.S. Pat. No. 5,137,799, issued Aug. 11, 1992, and Japanese Kokai No. 88-232654.

In U.S. Pat. No. 5,137,799, Kaempf et al., electronically conducting polymers are mixed with conventional photoresists to yield resist films which dissipate electrostatic charges during electron beam lithography, thus preventing distortion of the image and unsatisfactory image reproduction. In this context, the conducting polymer does not act as the photoresist but increases electronic conductivity sufficient to dissipate a charge. However, a person skilled in the art would consider these composite films to be non-conductive since the reported conductivities are exceedingly low, i.e., <$10^{-6}$ $\Omega^{-1}$ $cm^{-1}$.

It is reported that prolonged irradiation of π-conjugated thiophenes (oligomers and polymers) results in a loss of π-conjugation and hence these substances cannot be oxidized to form highly conducting materials, i.e. >$10^{-2}$ S/cm (Holdcroft et al., Chem. Mater. 3 (1991) 1003). The fact that films of these polymers can be irradiated with mild doses of UV or visible light to produce cross-linked films and insolubilized with the π-conjugated system virtually intact is an original finding and could not have been predicted from previously published or patented work.

In Kaempf et al., the process involves a composite comprising a conducting polymer and a polymer which is sensitive to ionizing radiation. When the radiation sensitive polymer, namely, poly(methylmethacrylate), is irradiated, chain scission of that polymer occurs and the mixture is therefore rendered more soluble. The key component in Kaempf et al. is the reaction of the non-conducting polymer, not the conducting polymer. In Kaempf et al., the non-conductive polymers are degraded by irradiation rather than being cross-linked. As a result of the conductive polymer being only a minor component in Kaempf et al., the conductivities of the Kaempf et al. system are a billion times ($10^{10}$) less conductive (Example 2 of Kaempf et al. exhibited a conductivity of $10^{-8}$ S/cm) than the conductive polymer images disclosed and claimed by the applicant herein, namely 100 S/cm.

U.S. Pat. No. 4,962,158, Kobayashi et al., discloses a process in which a composite comprising conducting polymer and a polymerizable free radical compound is rendered insoluble by a free radical initiator. When the initiator is activated by light, this leads to photoinsolubilization. The key component in the insolubilization step is the polymerizable component, not the conducting polymer.

In the applicants' technology, the conducting polymer is the polymerizable material. This is an important and basic difference compared to the prior art. The applicants have discovered that irradiation of π-conjugated thiophenes (oligomers and polymers) will cause cross-linking and insolubilization. The applicants have also discovered that π-conjugated thiophenes (oligomers and polymers) that have been cross-linked and insolubilized by irradiation can still be oxidized to form materials of substantially conductive materials.

As a result of the applicants' discovery, conducting polymers which are not diluted following imaging can be produced. The resulting polymers have much higher conductivities of 100 S/cm. Since the conductive polymer is only a minor component, the conductivities of Kobayashi's systems are 100–10,000 times less conductive than the conductive polymer images disclosed in the applicants' technology.

The present invention has the following significant distinctions from U.S. Pat. No. 5,137,799 and U.S. Pat. No. 4,962,158:

1. The electronically conducting polymer in the subject invention is both the photo-resist and the non-photo-resist. In U.S. Pat. No. 4,988,608, Tanaka et al., the use of polymeric sulfonium salts and polymeric methanolic thienyls as precursors is necessary. In the prior art, photosensitive additives are used in addition to conducting polymers to obtain an image upon irradiation.
2. Image formation is obtained using UV or visible light in the order of 250 to 700 nm, by photolithography or direct laser writing and not by electron-beam lithography.
3. Large electronic conductivities are achieved (in excess of 100 $\Omega^{-1}$ cm$^{-1}$) because the conducting polymer is not diluted by any additional non-conducting polymers, as in the prior art.
4. Electronically conducting pathways useful to microelectronic devices can be formed.

We have invented oxidative doping of π-conjugated polymers using solutions of gold trichloride to yield stable and conductive polymers. Furthermore, the versatility of the oxidation chemistry enables electroless deposition of zero-valent gold under controlled conditions leading to metal/polymer composites having conductivities up to 11,000 S cm$^{-1}$; a value 10,000 times that observed using alternative oxidation chemistries. Poly(3-hexylthiophene) was employed as a model π-conjugated polymer for these studies.

DETAILED DESCRIPTION OF PREFERRED EMBODIMENT

We have discovered that films of soluble polythiophenes, oligothiophenes, and derivatives, or combinations thereof, cast upon solid surfaces (substrates), undergo cross-linking when irradiated with electromagnetic radiation of wavelengths sufficient to cause an electronic transition in the molecule. It is reported that prolonged irradiation of π-conjugated thiophenes (oligomers and polymers) results in a loss of π-conjugation and hence these substances cannot be oxidized to form highly conducting materials, i.e. >10$^{-2}$ S/cm (Holdcroft et al., Chem. Mater. 3 (1991) 1003). The fact that films of these polymers can be irradiated with mild doses of UV or visible light to produce cross-linked films and insolubilized with the π-conjugated system virtually intact is an original finding and could not have been predicted from previously published or patented work. Such irradiation may include e-beam, gamma, X-ray, UV or visible. Irradiation through a photomask, or by direct laser lithography, forms a relief image in the polymer. The relief image can be observed due to the colour contrast between exposed and unexposed regions. Immersion of the exposed substrate/polymer into an appropriate solvent causes dissolution of the unexposed regions but does not dissolve exposed regions. The polymeric pattern remaining can be oxidized to yield a highly conducting pattern which is not diluted by any additives.

Polythiophenes or oligothiophenes which can be employed must be soluble in the developing solvent. The choice of solvent is dependent on the polymer/oligomer employed. Polythiophenes and oligothiophenes compatible with this invention include those derivatized at the 3- or 3,4-position with ether, amide, alkyl, alkoxy, or any other functionality which promotes solubility or improved intrinsic properties of the material. It is important to note that the functionality is chosen specifically to impart desirable properties on the polymer or oligomer, such as solubility, but is not necessary for the photo-cross-linking process to occur. Examples of such polymers/oligomers are those based on 3-alkylthiophenes, 3,4-alkylthiophenes, 3-alkoxythiophenes, 3,4-alkoxythiophenes and 3-alkylsulfonates.

Polythiophenes which possess non-conducting residues in the main chain may also be used in this invention. These include polymeric or oligomeric blocks of thiophenes joined at the α-position by functionality such as alkyls, ketones, aromatic, amides, ethers, or esters.

Substrates onto which polymer films can be deposited include silicon, III–V semiconductors, glass, polymer sheet, oxide layers, or any other surface capable of supporting a polymer film. Polymers can be deposited by spin casting, solvent evaporation, or spray casting. The concentration of solutions from which films are deposited depends on the polymer/solvent composition and can be between 30 and 0.1 wt %.

Alternatively, polymers can be deposited onto conductive materials by electrochemical deposition, but the polymers must be reduced prior to lithography.

Irradiation sources include UV/vis light sources in the range 250–700 nm and lasers of suitable wavelength. Choice of the developing solutions depends on the polymer employed but may include aromatics, aliphatic esters, ethers, chlorinated solvents, glycol ethers, ketones, water or appropriate mixtures thereof.

Oxidants which impart electronic conductivity to the irradiated cross-linked polymer include nitrosonium salts, halogens or inorganic compounds of high oxidizing power, such as ferric and ceric salts. Alternatively, the material can be electrochemically oxidized or it can be oxidized photochemically by the incorporation and photolysis of photochemically active oxidants such as diaryliodonium and triarylsulfonium salts. Conductivities of the oxidized polymeric patterns can range from 100 to 1 $\Omega^{-1}$cm$^{-4}$, which is much higher than in the prior art. It is expected that further modification of polythiophenes and oligothiophenes or different thin film deposition techniques will produce higher conductivities.

Figure 4A:
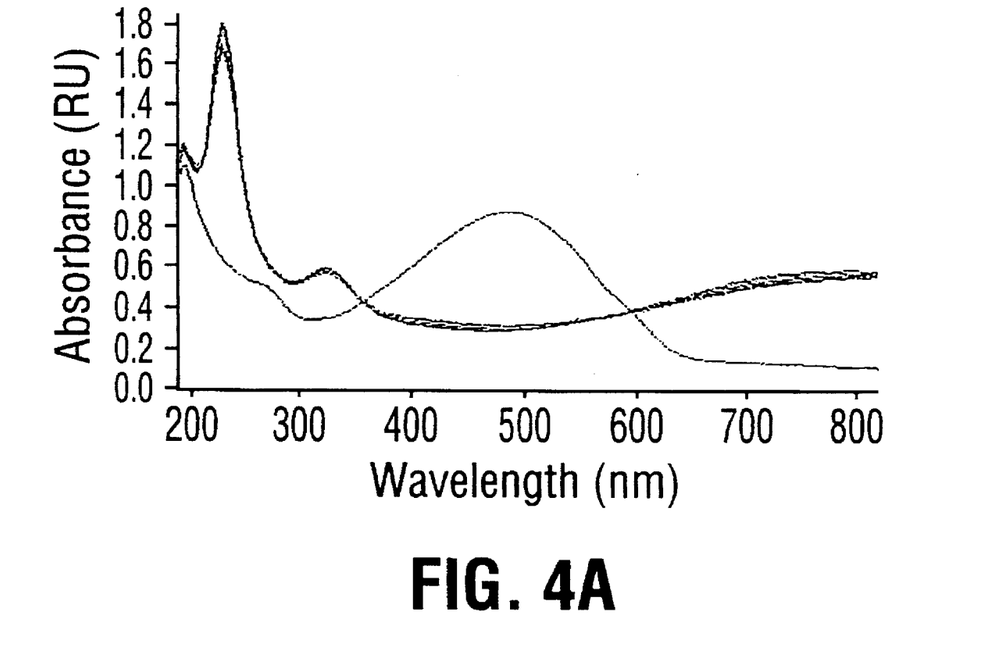
Figure 4B:
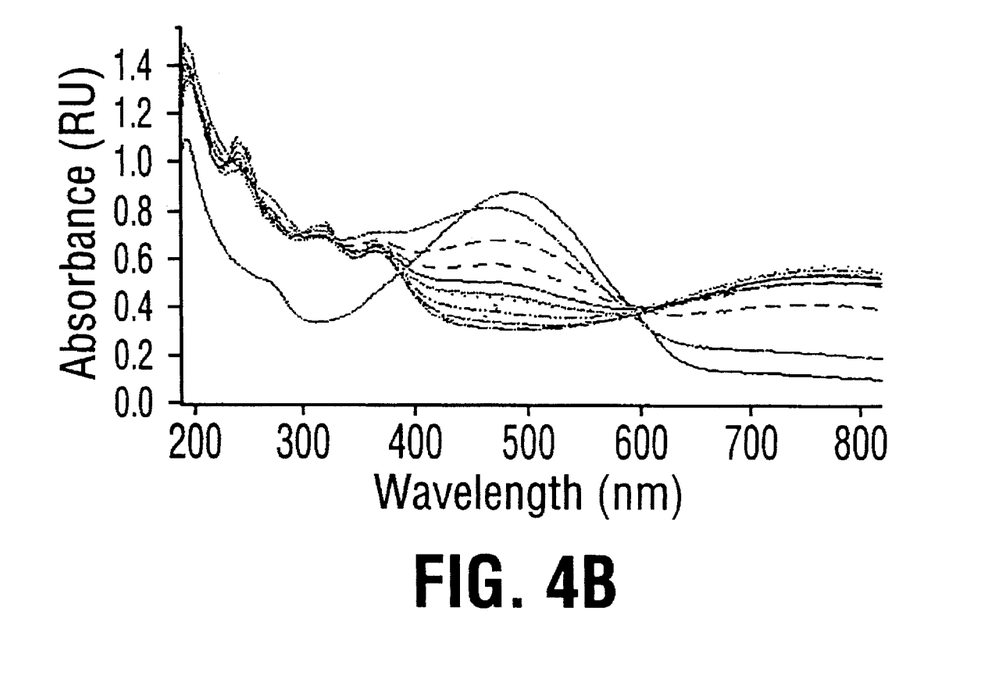

We have noted that red-coloured films of poly(3-hexylthiophene) on glass slides turned blue when immersed in a solution of nitromethane solution of AuCl$_3$. The colour change is a result of oxidation of the polymer and arises from optical-induced electronic transitions involving charge-carrying bipolaronic states. Optical absorbance spectra of neutral and oxidized films are shown in FIG. 4A and 4B. FIGS. 4A and 4B illustrate the changes in UV/vis absorption spectra of oxidized films of poly(3-hexylthiophene). In FIG. 4A, the oxidant is AuCl$_3$. Line (a) represents before oxidation, line (b) represents oxidized polymer where t=0 min, and line (c) (which is superimposed on line (b)) represents t=3 weeks. In FIG. 4B, the oxidant is FeCl$_3$. Line (a) indicates before oxidation, line (b) represents oxidized polymer (t=0 min), line (c) represents t=60 min. Oxidized films remained stable even after many weeks as observed by optical spectroscopy. In contrast, poly(3-hexylthiophene) oxidized using conventional oxidants such as ferric trichloride, nitrosonium tetrafluoroborate, and using electrochemical means, were relatively unstable.

Figure 5:
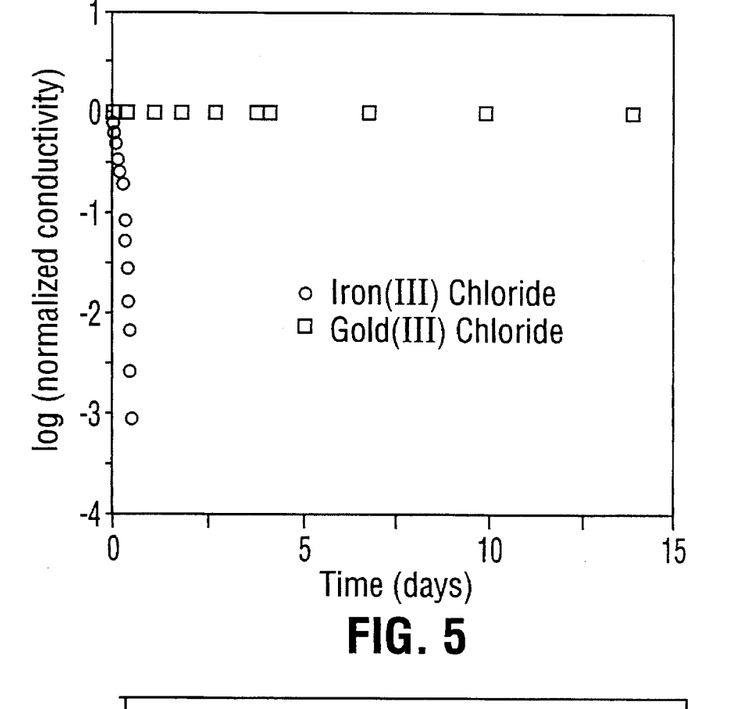
FIG. 5 represents normalized plots of electronic conductivity versus time for films of poly(3-hexylthiophene) on glass. Film thickness: 1 μm. The oxidant denoted by squares is $AuCl_3$. Initial conductivity: 10 $\Omega^{-1}$ $cm^{-1}$. The oxidant denoted by circles is $FeCl_3$. Initial conductivity: 10 $\Omega^{-1}$ $cm^{-1}$.

The minimum electronic conductivity of polymer films oxidized by $AuCl_3$ was 5 S $cm^{-1}$. No decrease in conductivity was observed even after 3 weeks, in contrast to those oxidized with $FeCl_3$. FIG. 5 shows normalized plots of conductivity versus time for films oxidized with $AuCl_3$ and $FeCl_3$. Specifically, FIG. 5 represents normalized plots of electronic conductivity versus time for films of poly(3-hexylthiophene) on glass. Film thickness: 1 μm. The oxidant denoted by squares is $AuCl_3$. Initial conductivity: 10 $\Omega^{-1}$ $cm^{-1}$. The oxidant denoted by circles is $FeCl_3$. Initial conductivity: 10 $\Omega^{-1}$ $cm^{-1}$.

Figure 6:
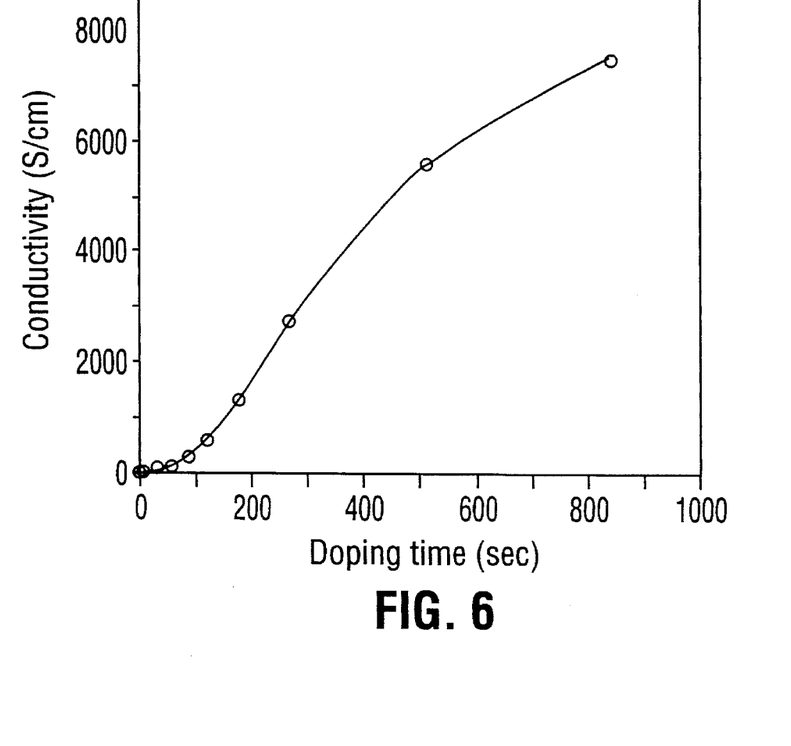
FIG. 6 illustrates the conductivity of oxidized poly(3-hexylthiophene) versus time period of oxidation. Oxidant: $AuCl_3$. Range of film thickness: 0.1–10 μm.

FIG. 6 illustrates the conductivity of oxidized poly(3-hexylthiophene) versus time period of oxidation. Oxidant: $AuCl_3$. Range of film thickness: 0.1–10 μm.

UV/vis absorption spectra of oxidized films show ligand-to-metal charge transfer bands of $AuCl_4^-$ at 232 and 236 nm. Depth profile analysis using Auger electron spectroscopy establishes Au distributed uniformly through the film from which it can be implied that the dopant ion is $AuCl_4^-$.

Oxidation of thicker films of $AuCl_3$ afforded films of poly(3-hexylthiophene) with even larger electronic conductivities and the films took on a metallic gold lustre. Prolonged exposure to $AuCl_3$ resulted in the deposition of a homogeneous metallic gold layer. Electrical conductivities of up to 11,000 S $cm^{-1}$ reflected the establishment of gold. Inspection of the polymer/glass and polymer/solution interface revealed that gold was deposited largely at the latter. Depth profile analysis by Auger electron spectroscopy confirmed the accumulation of metallic gold at the surface.

Kinetic studies of the rate of oxidation of 1 μm thick films and the rate of consumption of $AuCl_3$ inform that the former is substantially faster: oxidation of the film took 180 seconds whereas the concentration of $AuCl_3$ continued to decrease long after that time and reached equilibrium after 15 minutes. While the art of electroless deposition of zero-valent gold is well developed, mechanistic pathways are not. However, the fact that $AuCl_3$ continues to be consumed in the deposition process suggests that deposition is catalyzed by $AuCl_3$.

An important requirement for all practical conducting polymers is long term stability. While this is observed for $AuCl_4^-$-doped poly(3-hexylthiophene) at room temperature, de-doping occurred at elevated temperature (>100° C.) with concurrent loss of electronic conductivity. A similar observation is made with $FeCl_4^-$-doped poly(3-hexylthiophene) except the decomposition product is $FeCl_2$. Thermally undoped films were red in colour but showed a loss in transparency presumably due to the formation of finely divided metallic gold in the film. Thick polymer films possessing a homogeneous layer of gold on the surface do not lose conductivity upon thermal treatment.

Oxidative doping and electroless deposition of Au(0) is not restricted to poly(3-alkylthiophenes). Indeed, we have observed stable conductive forms of poly(thienyl vinylene), polyacetylene, polypyrrole, poly(3-alkoxythiophenes) and even polythiophene itself which has a relatively high oxidation potential. Use of metal salts for depositing zero-valent Pt, Pd and Ag with subsequent oxidation of π-conjugated polymers has previously been reported but the resulting polymers have not exhibited the remarkable stability of the $AuCl_4^-$-doped materials. Furthermore, deposition of the above metals does not produce homogeneous metallic films. Usually, metallic films on conducting polymers are achieved by electroplating.

EXAMPLE 1

To determine the mechanism of cross-linking and image formation, infra-red (IR) spectra of thin polythiophene films were recorded before and after irradiation in ambient atmosphere. Irradiation was performed through a 353 nm broadband filter (handpass 30 nm at half height) in order to isolate the π-π* transition. After photolysis, the IR spectrum of the irradiated polymer showed several new absorption bands: 2359, 2341, 1719, 1249, 1192, 1165, 1078 and 669 $cm^{-1}$. The absorption band at 1719 $cm^{-1}$, and the bands at 1192 and 1165 $cm^{-1}$ are assigned to a C=O and C=S→0 group respectively. Similar absorption bands have been observed for poly(3-hexylthiophene) irradiated in organic solutions and for monomeric thienyl analogues. The absorption bands at 2359 and 2341 $cm^{-1}$ are due to inequalities of path length. However, after irradiation, it appears that $CO_2$ is generated in the film. Other IR bands were not assigned. The resulting polymer films were totally insoluble in toluene, even when excitation of the polymer had been limited to the π-π* transition.

EXAMPLE 2

When thin films were irradiated in an argon atmosphere, the changes in the IR spectra were minimal, even after prolonged photolysis. More importantly, the films dissolved readily in toluene. IR indicated evidence for the formation of trace quantities of $CO_2$ and ketones formation (2361 and 1760 $cm^{-1}$ respectively) but these were extremely low compared to films irradiated in air. No IR band corresponding to C=S→0 was observed. Since the atmosphere above the polymer film was purged with argon at room temperature, i.e. below the glass transition temperature of the polymer, it is believed that trapped oxygen is the source of oxygen containing products.

The inventors have demonstrated that dissolved oxygen plays a large role in the solution of photochemistry of poly(3-hexylthiophene) (see S. Holdcroft, "Photochain Scission of the Soluble Electronically Conducting Polymer: Poly(3-hexylthiophene)" Macromolecules, 24 (1991) 2119–2121). It was postulated that the polymer photosensitizes singlet oxygen formation, and that addition of the latter to thienyl rings is responsible for chain scission and disruption of the π-system. The presence of oxygen is clearly a major factor in the solid state photochemistry of P3HT and it appears that Diels-Alder addition of singlet oxygen to thienyl units occurs, as evidenced by the formation of a sulfine. This in itself would not lead to cross-linking and insolubilization and the complete mechanism of photolysis is under investigation.

The following are examples of the photoimaging process:

EXAMPLE 3

Synthesis of Poly(3-hexylthiophene)

3-Hexylthiophene was synthesized by coupling the Grignard reagent of 3-bromothiophene with 1-bromohexane using bis(1,3-diphenylphosphino)propane nickel(II)chloride as catalyst. The product was purified by fractional distillation under reduced pressure. Polymerization of the monomer was achieved by mixing a 0.1M solution of 3-hexylthiophene in chloroform with a 0.4M chloroform solution of anhydrous ferric chloride. The mixture was stirred for two hours prior to precipitation into acidified methanol. The solid product was filtered, washed with $NH_4OH$, water and methanol. The crude polymer was dissolved in hot dichloromethane and insoluble products were removed by filtration. Low molecular products were removed by cooling the filtrate and adding methanol. The precipitate was filtered and dried in a vacuum oven. The polymer possessed IR bands at 3027, 2930, 2859, 1458, 819, and 725 cm$^{-1}$. The polymer had a number-average molecular weight of 9300 and a polydispersity index of 2.3.

The films of polymer (1.0 μm) were cast onto glass slides by solvent evaporation using dilute solutions of polymer in toluene. Poly(3-hexylthiophene) gave uniform, red-coloured films. The maximum wavelength of absorption in the visible region was 500 nm at 25° C. The long wavelength of absorption is due to extensive conjugation of π-orbitals.

Figure 2:
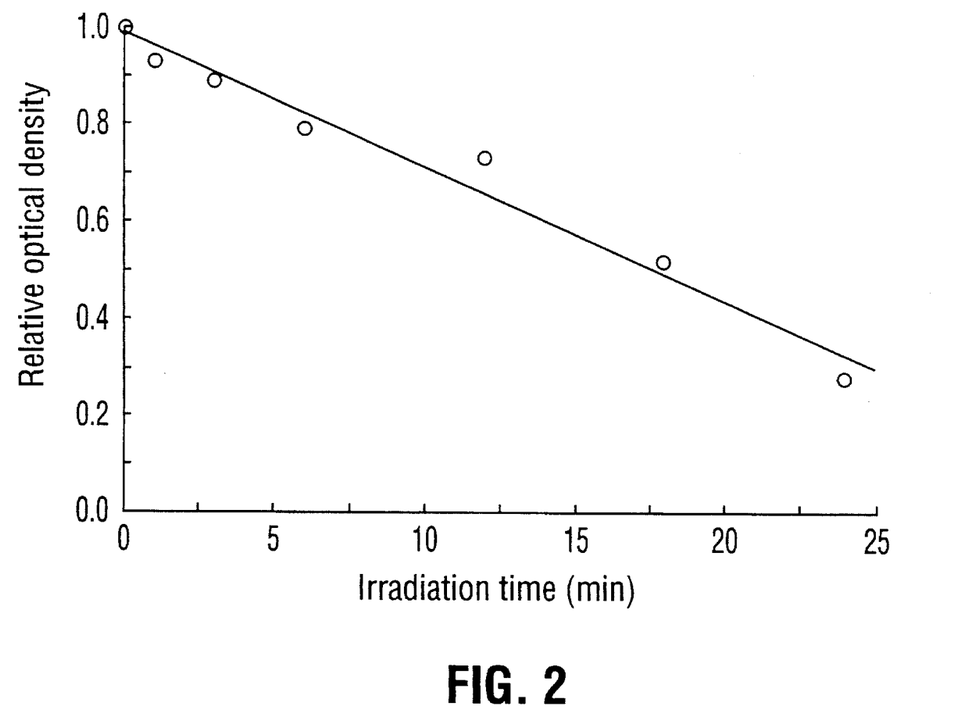
FIG. 2 represents a graphical depiction of relative optical density versus irradiation time of a polymer film.

Relief images in polymers were formed by irradiation with a 150 W Hg lamp. A quartz filter containing water was placed between the lamp and polymer/substrate to eliminate high intensity irradiation and absorb excess heat. A brass photomask was placed over the polymer/substrate. The lines in the photomask were 1 mm in width and several mm in length. The polymer/substrate and photomask were irradiated for 15 seconds. Where light struck the film, the optical density of the film decreased, i.e., the intensity of the red colour diminished (see FIG. 2). Detailed study showed that the optical density, and thus the number of π-conjugated segments in exposed regions had decreased by only 5%. Upon immersion of the irradiated film into toluene, the unexposed regions dissolved and the exposed regions remained. After drying at ambient or elevated temperatures, a red coloured polymeric image of the photomask remained.

Neutral polymer films were non-conducting (<10$^{-8}$ Ω$^-$cm$^{-1}$). However, upon oxidative doping by immersion of the films into an anhydrous solution of nitrosonium tetrafluoroborate, the films turned blue in colour and were deemed electronically conductive by the four-point probe technique. The conductivity of the polymeric regions was 5 Ω$^{-1}$ cm$^{-1}$. This was virtually identical to unirradiated oxidized thin films of poly(3-hexylthiophene), indicating that irradiation had not led to a deterioration of conductivity. It should be noted that in our tests, the conductivity of poly(3-hexylthiophene) was ~5 Ω$^{-1}$ cm$^{-1}$, whereas in other laboratories, conductivities as high as 100 Ω$^{-1}$ cm$^{-1}$ are reported, possibly due to differing methods of polymer deposition onto substrates. Clearly, even in these simple systems, there is ample room for increasing the conductivities of the final pattern. The conductivity of the resultant pattern could be changed by controlling the time of immersion in the oxidizing agent and/or controlling the concentration of the oxidizing solution. In this manner, the conductivity was varied over eight orders of magnitude.

Figure 3:
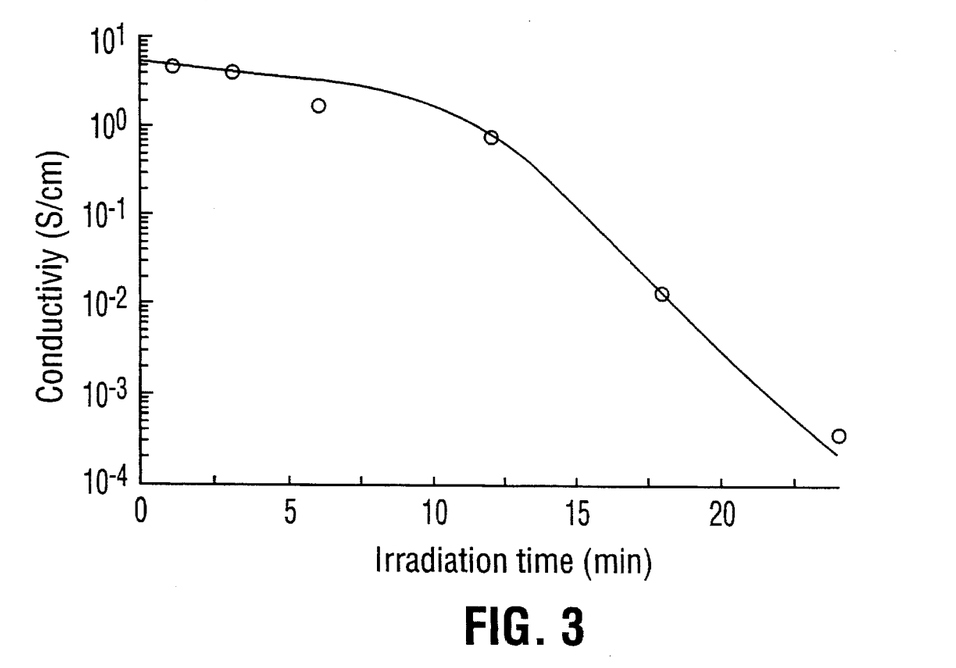
FIG. 3 represents a graphical depiction of conductivity versus irradiation time of an oxidized polymer film.

Prolonged irradiation of neutral films produced two effects. Firstly, the exposed regions showed significantly greater decrease in optical density, resulting in a larger contrast in colour between exposed regions and unexposed regions. Secondly, the resultant conductivity after pattern development and oxidation was significantly lower. For example, after 1, 3, 6, 12, 18 and 24 minutes of irradiation, the conductivity of oxidized films had decreased by 13.80, 24.20, 67.00, 84.60, 99.70 and 99.99% respectively, compared to unirradiated oxidized films (see FIG. 3). The conductivity/resistivity of the pattern was directly related to the time of irradiation.

EXAMPLE 4

The material, polymer/substrate preparation, and irradiation set up was the same as in Example 3 except that a 353 nm broadband filter was placed between the irradiation source and the polymer/substrate. By filtering out the high intensity irradiation, i.e., wavelengths <300 nm), we assured that the electronic transition was a π-π* transition and that conjugation in these materials was paramount to pattern formation. Under these conditions, longer irradiation times were required for image formation. Even so, after only two minutes of irradiation, well developed patterns could be produced. The electronic conductivities of the oxidized patterns were 98% of oxidized unirradiated polymer films. Prolonged exposure caused conductivies to drop dramatically.

EXAMPLE 5

Poly(3-hexylthiophene) films, 1 μm in thickness, on silicon substrates were investigated for their response to direct-write laser lithography. A 50 mW cadmium laser giving monochromatic light of 420 nm was focused onto the polymer film. The diameter of the focused light was 2 microns. The laser spot was moved across the surface by computer controlled hardware so as to write a controlled pattern into the polymer. The image was observed by viewing under a microscope. After development of the image by immersion of the polymer/substrate in toluene, a red-coloured, polymeric pattern which exactly reproduced the laser path was observed. The pattern was oxidized as previously described and the conductivity was found to be relatively unchanged compared to irradiated and oxidized films. Well developed patterns for line widths of 2, 4, 8, 16, 32 and 64 microns were obtained by this technique. The resolution of the pattern was limited only by the spot size of the laser, i.e., 2 microns.

COMMERCIAL APPLICATIONS FOE THE INVENTION

The commercial applications for the technology of the invention are mainly electronic in nature. The technology can be applied to any process in which the architecture of electronically conducting channels needs careful control. For this reason, the invention has broad ramifications. However, there are numerous specific applications.

1. One possible application is the fabrication of interconnects for microchip fabrication. In this process, active components of the microchip transistor are connected to passive components, or to other active components. The commercial process of interconnect fabrication has been previously described. In this context, the invention can be employed to fabricate interconnects with speed and precision using photosensitive electronically conducting polymers. Reducing the number of lithographic steps by this method is much more convenient and would represent considerable savings in the conventional interconnect process cost.

Interconnect fabrication costs will be of significant importance in multichip module fabrication where individual microchips are specifically interconnected to one another via conducting channels in order to achieve faster processing speeds and higher I/O accommodation, i.e., large scale integration, very large scale integration and other multichip module devices. The market for this "next generation" microchip assembly is expected to exceed $20 billion by the year 2000.

2. In a manner similar to that described above for microchips, the technology of the invention can be applied to dimensionally larger integrated circuit systems.

3. Many devices require controlled resistances in the form of resistive channels in contrast to conductive metallic channels. Generally, inorganic materials are used for controlled resistances and thus material processing can be difficult. Using the present invention, channels of polymer can be deposited on substrates in a controlled manner. Initially, the materials are in the neutral and insulating form. However, as previously described, the conductivity can be increased by partial oxidation. Furthermore, the conductivity or resistance of the polymer channel can be controlled by careful choice of the oxidizing agent since the extent of polymer oxidation is directly related to the oxidizing strength of the oxidant. Since the resistivity of the channel is controlled by the degree of oxidation of the polymer it is possible to finely tune the resistance. This invention addresses the problem of depositing resistive channels in a controlled manner.

4. The discipline of photonics is rapidly advancing. The driving force is that many devices and technologies in the future will be optical-based, for example, optical computation. Information will be communicated by photons through waveguides or optical channels in direct analogy to the conduction of electrons through conductors. To achieve this, non-linear optical effects are utilized for optical switching. It is not coincidence that the same materials which exhibit electronic conductivity in the oxidized state show large non-linear optical activity in the neutral state. The reason for this relation is extended $\pi$-electron conjugation. Polythiophenes are under intense investigation because of the extremely large third order susceptibilities exhibited by these materials. In essence, their refractive index changes rapidly and reversibly under the influence of high intensity light. Thus they can be used in optical switches and optical waveguides. This invention impacts upon non-linear optical device technology by presenting methodology for depositing channels of polythiophenes which will ultimately be used in waveguide fabrication.

5. New generation chemical sensors are hybrids of organic components and semiconductor devices such as field effect transistors. These devices are microelectronic and their fabrication requires conventional microlithographic techniques. It is extremely difficult to lay down organic functionality in ways compatible with microelectronic engineering. The present invention provides methodology for depositing organic polymers and oligomers in such a way that they can be integrated into a microelectronic device. Such organic materials can provide the bridge by which organic functionality can be attached to the device in a controlled manner.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A method of forming an electrically conducting pattern of an oxidizable $\pi$-conjugated polymer or $\pi$-conjugated oligomer which is electrically conducting in its oxidized form consisting essentially of:

(a) preparing a photomask which has one or more e-beam, gamma ray, X-ray, ultraviolet ray or light ray transmitting regions which correspond congruently with electricity conducting regions of the electrically conducting pattern, and one or more gamma ray, X-ray, ultraviolet ray or light ray blocking regions which correspond congruently with non-electricity conducting regions of the electrically conducting pattern;

(b) positioning the photomask between an e-beam gamma ray, X-ray, ultraviolet ray or visible light ray source and a $\pi$-conjugated polymer or $\pi$-conjugated oligomer;

(c) irradiating the $\pi$-conjugated polymer or $\pi$-conjugated oligomer with e-beam, gamma ray, X-ray, ultraviolet ray or visible light ray from the e-beam, gamma ray, X-ray, ultraviolet ray or visible light ray source through the photomask to produce e-beam, gamma ray, X-ray, ultraviolet ray or visible light ray exposed photomask corresponding regions of irradiated cross-linked $\pi$-conjugated polymer of $\pi$-conjugated oligomer and gamma ray, X-ray, ultraviolet ray or visible light ray blocked photomask corresponding unirradiated regions of non-cross-linked $\pi$-conjugated polymer or $\pi$-conjugated oligomer;

(d) dissolving the unirradiated regions of the $\pi$-conjugated polymer or $\pi$-conjugated oligomer using an appropriate solvent and leaving behind irradiated regions of undissolved cross-linked $\pi$-conjugated polymer or $\pi$-conjugated oligomer; and (e) oxidizing the undissolved cross-linked $\pi$-conjugated polymer or $\pi$-conjugated oligomer with an oxidant to form the electrically conducting pattern.

2. A method as claimed in claim 1 wherein the $\pi$-conjugated polymer or $\pi$-conjugated oligomer is exposed to laser light through light transmitting regions of the photomask.

3. A method as claimed in claim 2 wherein the $\pi$-conjugated polymer or $\pi$-conjugated oligomer is deposited on a substrate selected from the group consisting of silicone, III-E semi-conductor material, glass, polymer sheet, and an oxide compound, before the polymer is irradiated.

4. A method as claimed in claim 2 wherein a solvent used to dissolve the unirradiated polymer or oligomer is selected from the group consisting of an aromatic solvent, an aliphatic ester solvent, an ether, a chlorinated solvent, a glycol ether solvent, a ketone and water.

5. A method as claimed in claim 4 wherein the $\pi$-conjugated polymer or $\pi$-conjugated oligomer in step (e) is oxidized electrochemically.

6. A method as claimed in claim 4 wherein the $\pi$-conjugated polymer or $\pi$-conjugated oligomer in step (e) is oxidized photochemically by incorporating prior to irradiation a photochemically active oxidant in the $\pi$-conjugated polymer or $\pi$-conjugated oligomer.

7. A method as claimed in claim 2 wherein the oxidant used to impart electronic conductivity to the irradiated cross-linked $\pi$-conjugated polymer or $\pi$-conjugated oligomer is selected from the group of substances consisting of nitrosonium salts, halogens, ferric and ceric salts.

8. A method as claimed in claim 1 wherein the $\pi$-conjugated polymer or $\pi$-conjugated oligomer is deposited on a substrate selected from the group consisting of silicone, III-E semi-conductor material, glass, polymer sheet, and an oxide compound, before the polymer is irradiated.

9. A method as claimed in claim 8 wherein the $\pi$-conjugated polymer or $\pi$-conjugated oligomer is deposited as a thin film.

10. A method as claimed in claim 1 wherein a solvent used to dissolve the unirradiated polymer or oligomer is selected from the group consisting of an aromatic solvent, an aliphatic ester solvent, an ether, a chlorinated solvent, a glycol ether solvent, a ketone and water.

11. A method as claimed in claim 1 wherein the oxidant used to impart electronic conductivity to the irradiated cross-linked $\pi$-conjugated polymer or $\pi$-conjugated oligomer is selected from the group of substances consisting of nitrosonium salts, halogens, ferric and ceric salts.

12. A method as claimed in claim 1 wherein the π-conjugated polymer or π-conjugated oligomer in step (e) is oxidized electrochemically.

13. A method as claimed in claim 1 wherein the oxidant used to impart electronic conductivity to the irradiated cross-linked π-conjugated polymer or π-conjugated oligomer is a soluble auric compound.

14. A method as claimed in claim 13 wherein the auric compound is selected from the group of substances consisting of soluble gold trichloride, soluble gold tribromide, soluble gold tricyanide and chloroauric acid.

15. A method as claimed in claim 13 wherein the soluble auric compound is gold trichloride.

16. A method as claimed in claim 1 wherein the undissolved irradiated π-conjugated polymer or π-conjugated oligomer is treated prior to irradiation with a soluble auric compound to form metallic layers of gold on the π-conjugated polymer or π-conjugated oligomer.

17. A method as claimed in claim 16 wherein the soluble auric compound is gold trichloride.

18. A method as claimed in claim 1 wherein the π-conjugated polymer is a π-conjugated polythiophene.

19. A method as claimed in claim 18 wherein the π-conjugated polythiophene is modified at the 3- or 3,4-position with ether, amide, alkyl, alkoxy or any other chemical functional group which promotes solubility of the unirradiated polymer.

20. A method as claimed in claim 1 wherein the π-conjugated polymer or π-conjugated oligomer is based on a monomer selected from the group consisting of 3-alkylthiophene, 3,4-alkylthiophene, 3-alkoxythiophene, 3,4-alkoxythiophene and 3-alkylsulphonate.

21. A method as claimed in claim 1 wherein the π-conjugated polymer or π-conjugated oligomer is a thiophene block joined at the α position by an alkyl group, a ketone group, an aromatic group, an amide, an ether or an ester.

22. A method as claimed in claim 1 wherein the π-conjugated polymer or π-conjugated oligomer is selected from the group consisting of poly(thienylvinylene), polyacetylene, poly-pyrrole, poly(3-alkoxythiophene) and polythiophene.

23. A method as claimed in claim 1 wherein the π-conjugated polymer is poly(3-hexylthiophene).

24. A method as claimed in claim 1 wherein the undissolved cross-linked π-conjugated polymer or π-conjugated oligomer is photochemically oxidized by photolysis of a photochemically active oxidant incorporated in the π-conjugated polymer or π-conjugated oligomer.

25. A method as claimed in claim 24 wherein the oxidant is diaryliodonium or triarylsulfonium salt.

26. A method as claimed in claim 1 wherein the light is UV/visible light of a wavelength in the range 250 to 700 nm.

27. A method as claimed in claim 1 wherein the π-conjugated polymer or π-conjugated oligomer in step (e) is oxidized photochemically by incorporating prior to irradiation a photochemically active oxidant in the π-conjugated polymer or π-conjugated oligomer.

28. A method as claimed in claim 1 wherein the π-conjugated oligomer is π-conjugated oligothiophene.

29. A method as claimed in claim 28 wherein the π-conjugated oligothiophene is modified at the 3- or 3,4-position with ether, amide, alkyl, alkoxy or any other chemical functional group which promotes solubility of the unirradiated polymer.

30. A method of forming an electronically conducting pattern of an electricity conducting and non-electricity conducting regions of oxidizable π-conjugated polymer of π-conjugated oligomer which is electrically conducting in its oxidized form consisting essentially of:

(a) irradiating the π-conjugated polymer or π-conjugated oligomer by laser light lithography to produce light exposed irradiated cross-linked π-conjugated polymer or π-conjugated oligomer and unirradiated regions of non-cross-linked π-conjugated polymer or π-conjugated oligomer corresponding with the electrically conducting pattern;

(b) dissolving the unirradiated regions of the π-conjugated polymer or π-conjugated oligomer using an appropriate solvent and leaving behind irradiated regions of undissolved cross-linked π-conjugated polymer or π-conjugated oligomer; and (c) oxidizing the undissolved irradiated regions of cross-linked π-conjugated polymer or cross-linked π-conjugated oligomer with an oxidant to form the electrically conducting pattern.

* * * * *